US011264934B2

(12) United States Patent
Haselhuhn, Jr. et al.

(10) Patent No.: US 11,264,934 B2
(45) Date of Patent: Mar. 1, 2022

(54) METHOD TO CONTROL LOADS USING ISOLATED DRIVE CIRCUITS

(71) Applicant: Allegro MicroSystems, LLC, Manchester, NH (US)

(72) Inventors: Howard J. Haselhuhn, Jr., Brighton, MI (US); Timothy A. Clark, Clarkston, MI (US); Richard Garvey, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 118 days.

(21) Appl. No.: 16/930,592

(22) Filed: Jul. 16, 2020

(65) Prior Publication Data
US 2022/0021325 A1   Jan. 20, 2022

(51) Int. Cl.
*H02P 27/08* (2006.01)
*H03K 17/687* (2006.01)

(52) U.S. Cl.
CPC ......... *H02P 27/08* (2013.01); *H03K 17/6871* (2013.01)

(58) Field of Classification Search
CPC ...... H02P 1/00; H02P 1/04; H02P 1/16; H02P 1/163; H02P 1/18; H02P 1/24; H02P 1/42; H02P 1/46; H02P 6/26; H02P 6/28; H02P 6/32; H02P 6/085; H02P 7/00; H02P 7/025; H02P 7/05; H02P 7/293; H02P 8/00; H02P 8/165; H02P 11/04; H02P 11/06; H02P 13/00; H02P 21/22; H02P 23/00; H02P 25/062; H02P 27/00; H02P 27/024; H02P 27/06
See application file for complete search history.

(56) References Cited

U.S. PATENT DOCUMENTS

| 9,214,884 | B2 | 12/2015 | Sonoda et al. |
| 9,291,876 | B2 | 3/2016 | Cadugan et al. |
| 9,496,708 | B2 | 11/2016 | Chappell et al. |
| 10,181,810 | B2 | 1/2019 | Lu et al. |
| 10,312,847 | B2 | 6/2019 | Lu |
| 10,771,001 | B2 * | 9/2020 | Smolenaers ............ H02P 25/22 |

OTHER PUBLICATIONS

U.S. Appl. No. 16/746,275, filed Jan. 17, 2020, Liu et al.
Daughton, "Spin-Dependent Sensors;" Invited Paper; Proceedings of the IEEE, vol. 91, No. 5; May 2003; 6 Pages.

* cited by examiner

*Primary Examiner* — Antony M Paul
(74) *Attorney, Agent, or Firm* — Daly Crowley Mofford & Durkee, LLP

(57) ABSTRACT

Methods and apparatus for providing DC motor gate driver isolation. In embodiments, first and second DC input signals are received at a supply control module, which generates first and second control signals for controlling first and second switches. A first transformer has a primary winding having one end coupled to the first DC input signal and another end coupled to the first switch A second transformer has a primary winding having one end coupled to the second DC input signal and another end coupled to the second switch. The supply control module controls the first and second control signals so that a secondary winding of the first or second transformer energizes an isolated AC bus coupled to the first and second transformers. First and second gate drivers receive respective isolated AC signals from the isolated AC bus. Conversion of the isolated AC signals back to DC occurs at the point of use.

26 Claims, 5 Drawing Sheets

METHOD TO CONTROL LOADS USING ISOLATED DRIVE CIRCUITS

BACKGROUND

As is known in the art, motor drive systems can be used for DC motors. Such systems may require DC power supply isolation. In conventional configurations, an isolator may be used for DC to AC conversion and then AC to DC. For a three phase motor, some thirty-six or more power conversions may be required to accomplish the isolation function.

SUMMARY

Example embodiments of the invention provide methods and apparatus for drive circuit isolation for various applications, such as DC motor drive systems. In embodiments, a supply rail is converted to AC in a first isolation stage, after which motor phase control supply signals are then isolated using AC techniques. The AC signal is converted back to DC at the point of use, such as generating drive signals for switching elements.

In contrast, in conventional systems, isolation includes converting DC to AC, isolating the signals, and then converting the isolated AC to DC at each isolation level. Such configurations can require a significant number of DC-AC-DC signal conversions, discrete components, and high IC counts.

In some motor drive architectures, gate driver supply signals must be isolated from the source and from each other. Example embodiments of the invention include integrating primary and secondary supply channels with automatic output selection control based on whether the primary is present. In addition, there can be integrated isolation between primary and secondary supply monitor, communication, and control signals to reduce probability of single point failures. In embodiments, the gate drive supplies are isolated from the source and each other so the maximum voltage the gate driver needs is the maximum voltage range of the gate drive requirements which allows lower voltage processes to be used to produce ICs.

In one aspect, a method comprises: receiving a first DC input signal and a second DC input signal at a supply control module; generating, by the supply control module, a first control signal for controlling a first switch, and a second control signal for controlling a second switch, wherein a first transformer has a primary winding having one end coupled to the first DC input signal and another end coupled to the first switch, and a second transformer has a primary winding having one end coupled to the second DC input signal and another end coupled to the second switch; controlling, by the supply control module, the first and second control signals so that a secondary winding of the first or second transformer energizes an isolated AC bus coupled to the first and second transformers; receiving a first isolated AC signal at a first gate driver module for a motor phase, wherein the first isolated AC signal is generated by first and second coupled inductors, wherein the first coupled inductor is connected to the isolated AC bus; and receiving a second isolated AC signal at a second gate driver module for the motor phase, wherein the second isolated AC signal is generated by third and fourth coupled inductors, wherein the third coupled inductor is connected to the isolated AC bus.

A method can further include one or more of the following features: the second coupled inductor is coupled to a first terminal configured for coupling to a high side driver of the motor phase, the fourth coupled inductor is coupled to a first terminal configured for coupling to a low side driver of the motor phase, the first coupled inductor is coupled to the isolated AC bus, the first gate driver module controls a first motor switch configured for coupling the positive DC input signal to the motor phase, and the second gate driver module controls a second motor switch configured for coupling the negative DC input signal to the motor phase, and wherein the second coupled inductor is coupled to a node between the first and second motor switches, an isolated AC voltage on the second coupled winding is referenced to the voltage at the motor phase connection, the supply control module comprises an IC package, the first and second gate driver modules comprise IC packages, there is no conversion back to DC of the first DC input signal and/or the second DC input signal until DC rectification in the first and second gate driver modules, the supply control module comprises an oscillator and a regulator in a feed forward regulation configuration, the supply control module automatically switches between primary operation where the first DC input signal energizes the isolated AC bus and secondary operation wherein the second DC input signal energizes the isolated AC bus, rectifying, by the first and second gate driver modules, which comprise IC packages, the first isolated AC signal for generating voltage supply signals for the first and second gate driver modules, and/or the voltage supply signals include a first voltage supply signal, a negative voltage supply signal, and a programmable voltage supply signal.

In another aspect, a system comprises: a supply control module configured to receive a first DC input signal and a second DC input signal and to generate a first control signal for controlling a first switch and a second control signal for controlling a second switch; a first transformer including a primary winding having one end configured for coupling to the first DC input signal and another end coupled to the first switch, and a second transformer including a primary winding having one end configured for coupling to the second DC input signal and another end coupled to the second switch, wherein the supply control module is configured to control the first and second control signals so that a secondary winding of the first or second transformer energizes an isolated AC bus coupled to the first and second transformers; a first gate driver module for a motor phase configured to receive a first isolated AC signal generated by first and second coupled inductors, wherein the first coupled inductor is connected to the isolated AC bus; and a second gate driver module for the motor phase configured to receive a second isolated AC signal generated by third and fourth coupled inductors, wherein the third coupled inductor is connected to the isolated AC bus.

A system can further include one or more of the following features: the second coupled inductor is coupled to a first terminal configured for coupling to a high side driver of the motor phase, the fourth coupled inductor is coupled to a first terminal configured for coupling to a low side driver of the motor phase, the first coupled inductor is coupled to the isolated AC bus, the first gate driver module controls a first motor switch configured for coupling the positive DC input signal to the motor phase, and the second gate driver module controls a second motor switch configured for coupling the negative DC input signal to the motor phase, and wherein the second coupled inductor is coupled to a node between the first and second motor switches, an isolated AC voltage on the second coupled winding is referenced to the motor phase during operation of the motor, the supply control module comprises an IC package, the first and second gate driver modules comprise IC packages, the system is configured such that there is no conversion back to DC of the first DC input signal and/or the second DC input signal until rectified in the first and second gate driver modules, the supply control module comprises an oscillator and a regulator in a feed forward regulation configuration, the supply control module is configured to automatically switch between primary operation where the first DC input signal energizes the isolated AC bus and secondary operation wherein the second DC input signal energizes the isolated AC bus, the first and second gate driver modules, which comprise IC packages, includes a rectifier for generating voltage supply signals for the first and second gate driver module, and/or the voltage supply signals include a first voltage supply signal, a negative voltage supply signal, and a programmable voltage supply signal.

BRIEF DESCRIPTION OF THE DRAWINGS

The foregoing features of this invention, as well as the invention itself, may be more fully understood from the following description of the drawings in which.

DETAILED DESCRIPTION

Figure 1:
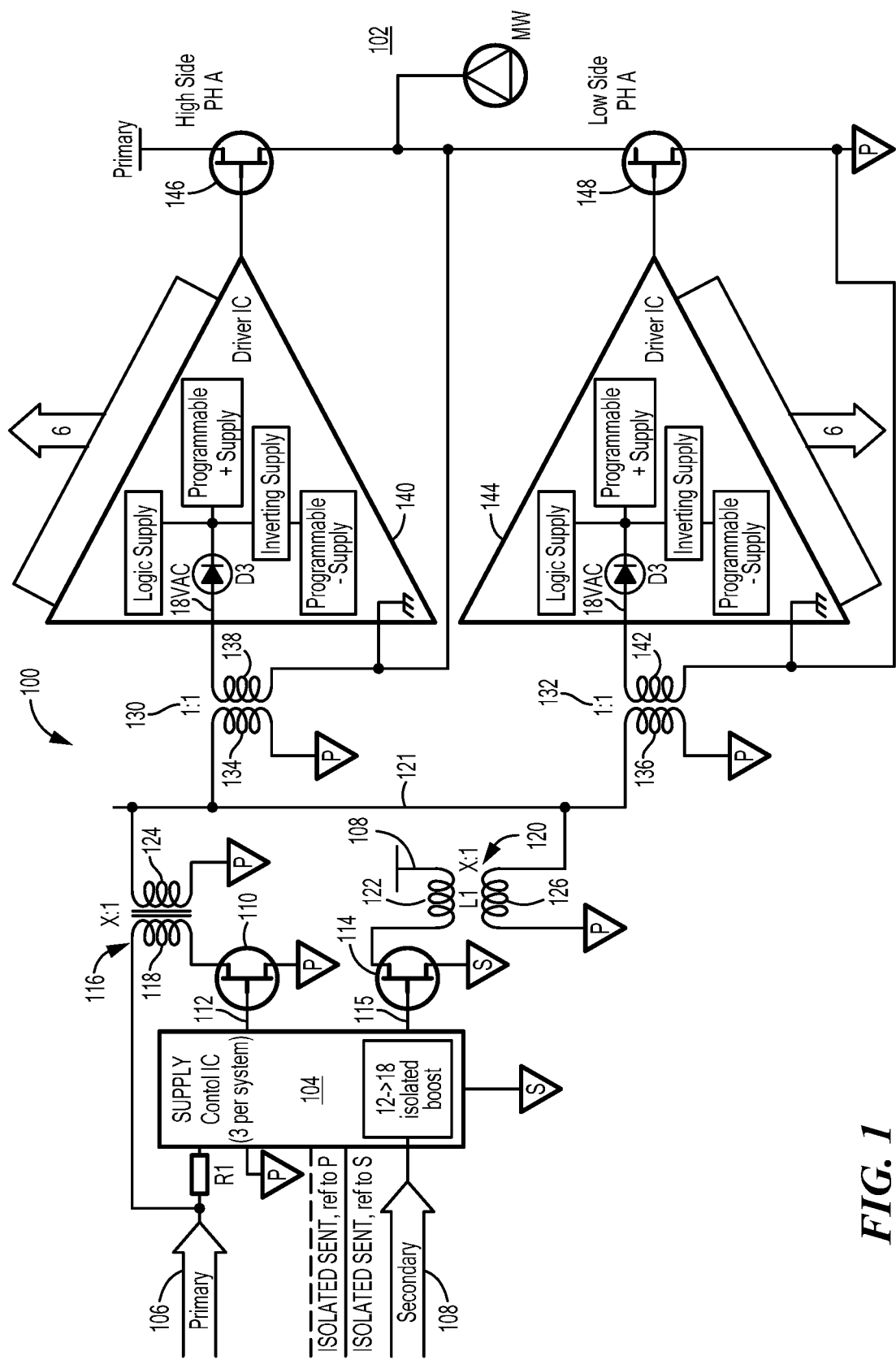
FIG. 1 is a schematic representation of an example system having drive circuit isolation.

FIG. 1 shows an example system 100 for driving one phase of a DC motor 102. A supply control module 104, which can be provided as an integrated circuit (IC), receives a primary DC input signal 106 and a secondary DC input signal 108. In example electric vehicle embodiments, the primary DC input signal 106 may be in the order of 600V and the secondary DC input signal 108 may be in the order of 24V. It is understood that any suitable voltages can be used to meet the needs of a particular application.

In the illustrated embodiment, a first switch 110 has a duty cycle controlled by a first output 112 of the supply control module 104 and a second switch 114 has a duty cycle controlled by a second output 115 of the supply control module. A first transformer 116 has a primary winding 118 with a first end coupled to the primary DC input signal 106 and the other end coupled to the first switch 110. A second transformer 120 has a primary winding 122 with a first end coupled to the secondary DC input signal 108 and the other end coupled to the second switch 112.

A secondary winding 124 of the first transformer 116 and a second winding 126 of the second transformer 120 provide an intermediate AC bus 121, which may be referred to as VACbus. In embodiments, at a given time, only the first transformer 116 (primary) or the second transformer 120 (secondary) is active. In an example embodiments, the intermediate bus 121 is at 18 VAC. The windings of the first and second transformers 116, 120 can have respective numbers of turns to meet the needs of a particular application.

In the illustrative embodiments, third and fourth coupled inductor pairs 130, 132 have respective primary windings 134, 136 coupled to the intermediate bus 121. In example embodiments, the inductor pairs 130, 132 have a one-to-one turns ratio. A secondary winding 138 of the first inductor pair 130 is coupled across first and second inputs of a first gate driver module 140 and a secondary winding 142 of the second inductor pair 132 is coupled across inputs of a second gate driver module 144. One end of the second winding 138 is coupled to the phase winding between the switches 146, 148. Similarly, one end of the secondary winding 142 is coupled to the second switch 148, which is coupled to ground.

With this arrangement, the voltage, e.g., 18 VAC, on the secondary winding 138 rides on the voltage at the motor winding MW of the high side motor phase, for example. The switch 146, which is coupled between the primary voltage, e.g., 600V DC, and the motor winding MW, has a conductive state controlled by the output of the first gate driver 140. Since the 18 VAC signal floats on the motor winding signal, control signal can get above the primary voltage to turn the first switch 146 on and below the motor winding voltage to turn the first switch off.

In example embodiments, the first and/or second gate driver modules 140, 144 are provided as integrated circuit packages. The first gate driver module 140 is coupled to a first driver switch 146, such as an IGBT, which is coupled to a high side of a first phase of a DC motor. The second gate driver module 144 is coupled to a second driver switch 148 coupled to a low side of the first motor phase.

In embodiments, there is no AC-DC conversion in any isolation stage. A common supply voltage is maintained in AC form after first isolation stage provided by the supply control module 104 and through subsequent isolation stages. There is only conversion back to DC at the point of use in the first and second gate drivers 140, 144.

In contrast, conventional systems use an isolator that converts DC to AC, isolates, then converts AC to DC in the following locations: primary to VDC bus on each motor phase, secondary to VDC bus on each motor phase, VDC bus to the High Side Driver on each motor phase, and VDC bus to the Low Side Driver on each motor phase for a total of 18 isolation circuits, each forming DC/AC—isolate—AC/DC conversions for a total of 36 power conversions. In conventional systems there are typically seven ICs per drive for a total of 42 ICs. In example embodiments there are three ICs per motor phase for a total of 9 ICs.

Figure 2:
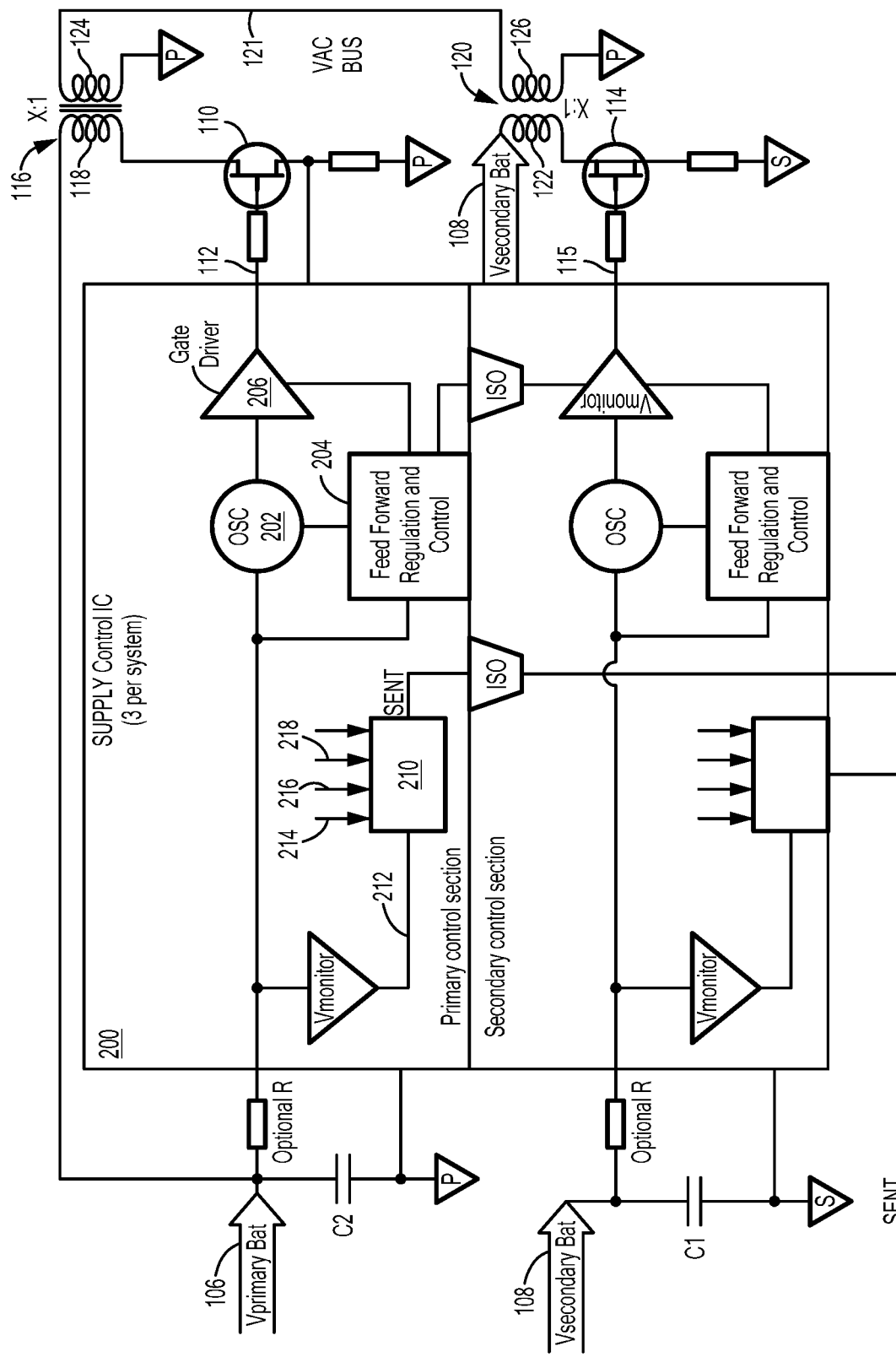
FIG. 2 is a schematic representation of example supply module that can form a part of the system of FIG. 1.

In example embodiments, signal conversions include:
- Primary supply to Vacbus (DC-AC) on each motor phase using a transformer and a power supply controller IC
- Secondary supply to Vacbus (DC-AC) on each motor phase using a transformer and a power supply controller IC
- Vacbus to High Side drive (AC-AC) on each motor phase using coupled inductors
- Vacbus to Low Side drive (AC-AC) on each motor phase using coupled inductors FIG. 2 shows an example implementation of a supply control IC 200, such as the supply control module 104 of FIG. 1, wherein like reference designations indicate like elements. The supply control IC 200 includes a first oscillator 202 and feed forward module 204 coupled to a gate driver 206 for the first switch 110. Feed forward regulators for generating gate driver signals are well known in the art.

In embodiments, the supply control IC 200 can switch between the primary and secondary modes. In one embodiment, normal operation refers to operation in which the primary signal 106, such as from the primary battery, is present. If the primary signal 106 is not present, the secondary signal 108 is used to energize the intermediate bus 121 and power the motor phase. In embodiments, the secondary signal can be boosted to 18 VAC, for example. The supply control IC 200 can automatically switch between primary secondary operation while ensuring that only one energizes the VACbus at a given time.

In embodiments, the supply control IC 200 can include monitoring of various signals. For the primary portion of the supply control IC, a monitor module 210 can receive input signals 212, 214 from the oscillator 202, output open/short signals 216, temperature signals 218, and the like. Similar signal monitoring can also be performed for the second portion of the supply control IC 210.

In embodiments, the supply control IC 200 can energize the driver ICs for a motor phase from the primary or secondary inputs. The supply control IC 200 can switch between primary and secondary signals without circuit destruction. For example, if the primary battery of an electric vehicle fails, a driver may be able to move the vehicle to a safe location or return home using power from the secondary battery.

Figure 3:
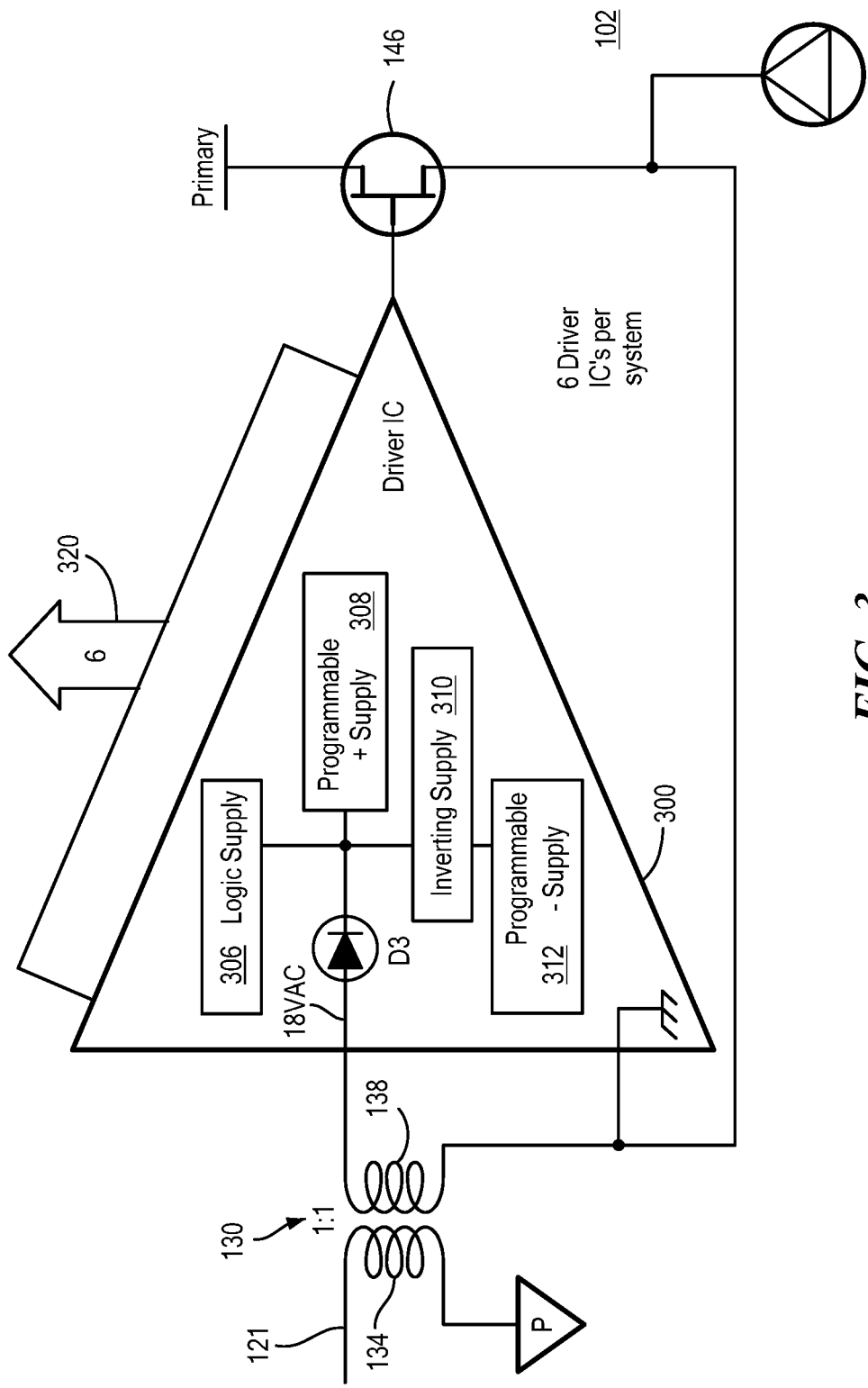
FIG. 3 is a schematic representation of an example gate drive module that can form a part of the system of FIG. 1.

FIG. 3 shows an example implementation of a gate driver integrated circuit 300, which may be similar to the gate driver module 140 of FIG. 1, wherein like reference designations indicate like elements. As described above, the secondary winding 138 of the coupled inductors 130 is coupled across inputs of the gate driver IC 300. In example embodiments, the secondary winding 138 has a voltage level of 18 VAC. A first end of the primary winding 134 is coupled to the VAC bus 121 and the other end is referenced to the VAC bus ground. One end of the secondary winding 138 is referenced to the motor winding 102 voltage.

The output of the gate driver IC 300 is coupled to the gate of the switch 146, which drives a motor phase 102. In embodiments, the switch 146 is coupled between a primary voltage, which may be in the order of 600V, and the motor winding 102 of a first motor phase.

In embodiments, the input from the secondary winding 138 is rectified 304. The rectified signal is used to generate desired supply signals for the IC, such as a logic supply 306, a programmable +supply 308, an inverting supply 310, and a programmable −supply 312. As noted above, these power supply signals can be generated from the AC signal input to the gate driver. These supply voltages can be controlled by the series of input signals that can include signals 320. The supply signals can be applied to the output of the Gate Drive IC 300 connected to the gate or emitter of the Motor Winding Bridge Components 146.

Monitoring circuitry integrated within the Gate Drive IC 300 can be used to create fault flags for internal and external signals. These fault flags can be used to generate the output signals in the Signals 320 that will alert a remote device to potential issues in the system. The fault flags can be read from the Gate Drive IC 300 using the protocol signals comprised in Signals 320.

A series of signals 320 can be sent to a remote device, such as motor control unit (MCU). Example signals include pulse width modulation (PWM) signals, enable signals, reset signals, protocol signals, such as SENT signals, diagnostic signals, safe state control (SSC) signals, and the like.

Conventional gate driver ICs use external regulators for V+ and discrete designed regulators for V− due to unique voltage levels. In contrast, in embodiments, a gate driver IC uses an AC voltage input instead of DC to the gate driver to allow for simpler isolation from primary and secondary sources.

Conventional systems require voltage feedback from the secondary side through isolators to the primary side. In contrast, in embodiments, regulation is performed on gate driver for reducing the number of required I/O pins and discrete parts.

Example embodiments combine primary and secondary supply controls and monitoring in one IC. External pass/switching elements can eliminate supply voltage dependencies on the primary channel. The use of coupled inductors for isolation of each gate driver supply reduces circuit board area requirements and lowers cost than use of transformer. Illustrative gate driver ICs integrate digital isolation, adjustable V+ and V-supplies for driving motor winding bridge components (e.g., FET, SiC, or IGBT), provides safety features per ISO26262, for example, and uses a floating reference to the source or emitter connection of the bridge switch component.

In embodiments, relatively small 1:1 coupled inductors can be used at each gate driver IC to create independent floating supplies with low cost and small board space. The need for secondary side regulation is eliminated in contrast to conventional configurations.

Figure 4:
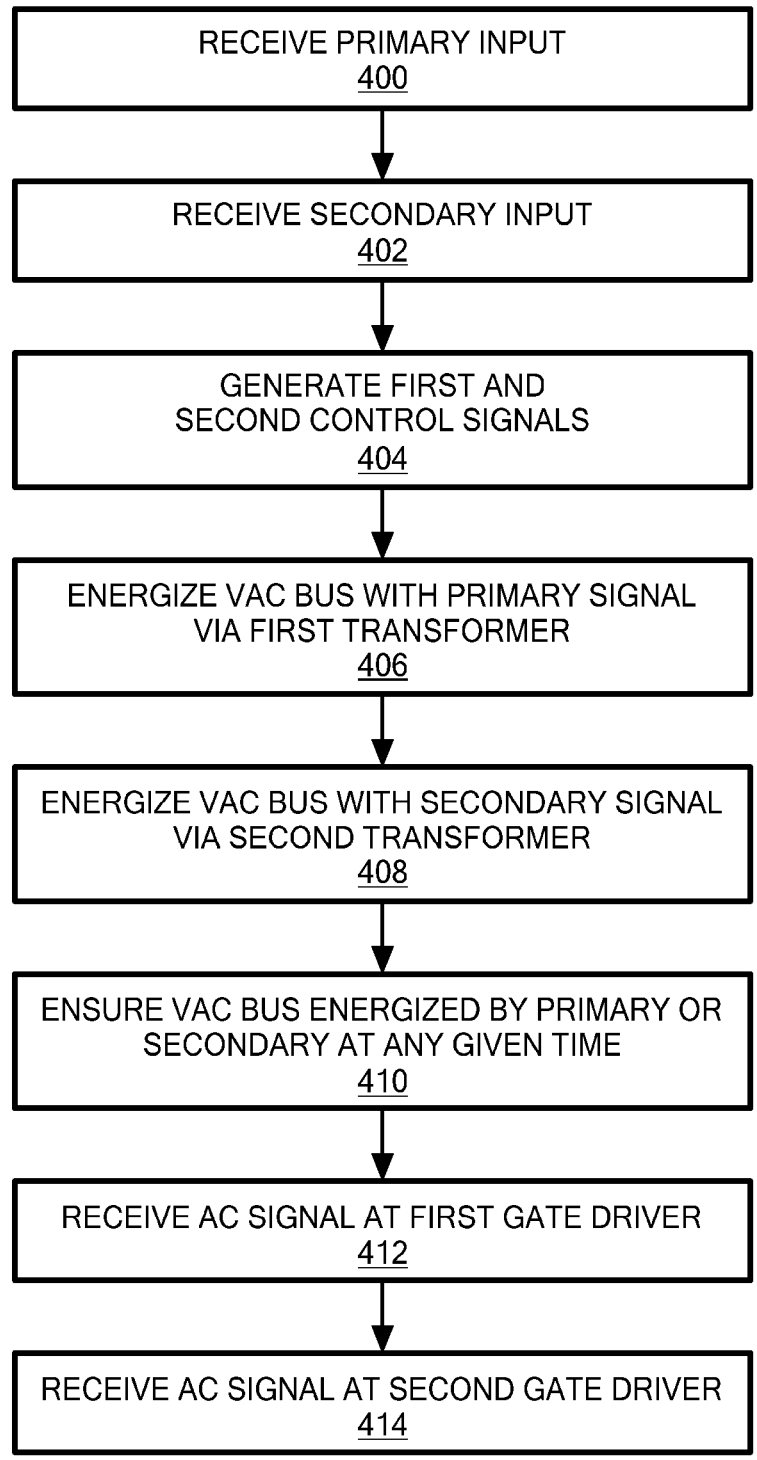
FIG. 4 is a flow diagram of an example sequence of steps for providing circuit isolation.

FIG. 4 shows an example sequence of steps for providing driver isolation in accordance with example embodiments of the invention. In step 400, a primary DC signal is provided to a supply control module, and in step 402, a secondary DC input signal is provided to the supply control module. In embodiments, the primary DC input signal may have a higher voltage level than the secondary DC input signal, however, voltage levels are application dependent. In one particular embodiment, the primary DC signal is provided by the primary battery of an electric vehicle, and the secondary DC signal is provided by a secondary battery.

In step 404, the supply control module provides a first control signal for a first switch and a second control signal for a second switch. In step 406, the supply control module controls the first control signal for generating an AC signal on a VAC bus via a first transformer coupled between the primary DC input signal and the first switch. In step 408, the supply control module controls the second control signal for generating an AC signal on the VAC bus via a second transformer coupled between the secondary DC input signal and the second switch. In step 410, supply control module ensures that only one of the primary or second signals is used to energize the VAC bus at a given time. In embodiments, the primary signal energizes the VAC bus unless the primary signal is not present, in which case the secondary signal energizes the VAC bus.

In step 412, a first gate driver module receives an AC input signal via first and second coupled inductors, one of which is coupled to the VAC bus. In step 414, a second gate driver module receives an AC input signal via third and fourth coupled inductors, one of which is coupled to the VAC bus. In embodiments, the first gate driver module drives a high side of a motor phase and the second gate driver module drives a low side of the motor phase.

U.S. Pat. Nos. 9,291,876 and 9,496,708 and 10,181,810 and 10,312,847, each of which is incorporated herein by reference, show various motor control features.

Figure 5:
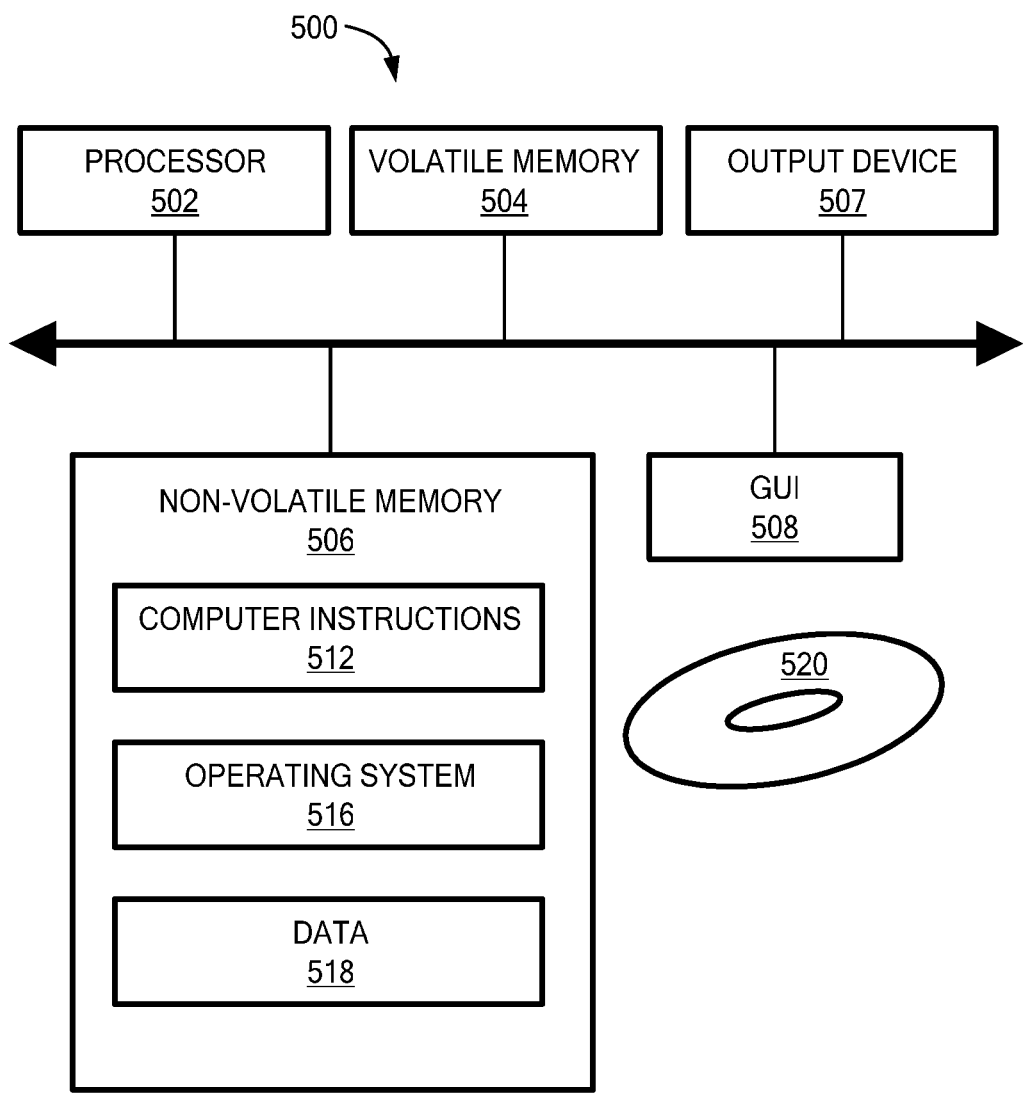
FIG. 5 is a schematic representation of an example computer that can perform at least a portion of the processing described herein.

FIG. 5 shows an exemplary computer 500 that can perform at least part of the processing described herein. The computer 500 includes a processor 502, a volatile memory 504, a non-volatile memory 506 (e.g., hard disk or Flash memory), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
   receiving a first DC input signal and a second DC input signal at a supply control module;
   generating, by the supply control module, a first control signal for controlling a first switch, and a second control signal for controlling a second switch,
   wherein a first transformer has a primary winding having one end coupled to the first DC input signal and another end coupled to the first switch, and a second transformer has a primary winding having one end coupled to the second DC input signal and another end coupled to the second switch;
   controlling, by the supply control module, the first and second control signals so that a secondary winding of the first or second transformer energizes an isolated AC bus coupled to the first and second transformers;
   receiving a first isolated AC signal at a first gate driver module for a motor phase, wherein the first isolated AC signal is generated by first and second coupled inductors, wherein the first coupled inductor is connected to the isolated AC bus; and
   receiving a second isolated AC signal at a second gate driver module for the motor phase, wherein the second isolated AC signal is generated by third and fourth coupled inductors, wherein the third coupled inductor is connected to the isolated AC bus.

2. The method according to claim 1, wherein the second coupled inductor is coupled to a first terminal configured for coupling to a high side drive of the motor phase.

3. The method according to claim 2, wherein the fourth coupled inductor is coupled to a first terminal configured for coupling to a low side drive of the motor phase.

4. The method according to claim 3, wherein the first coupled inductor is coupled to the isolated AC bus.

5. The method according to claim 4, wherein the first gate driver module controls a first motor switch configured for coupling the positive DC input to the motor phase, and the second gate driver module controls a second motor switch configured for coupling the negative DC input to the motor phase, and wherein the second coupled inductor is coupled to a node between the first and second motor switches.

6. The method according to claim 5, wherein an isolated AC voltage on the second coupled winding is referenced to the voltage at the motor phase connection.

7. The method according to claim 1, wherein the supply control module comprises an IC package.

8. The method according to claim 7, wherein the first and second gate driver modules comprise IC packages.

9. The method according to claim 1, wherein there is no conversion back to DC of the first DC input signal and/or the second DC input signal until DC rectification in the first and second gate driver modules.

10. The method according to claim 1, wherein the supply control module comprises an oscillator and a regulator in a feed forward regulation configuration.

11. The method according to claim 1, wherein the supply control module automatically switches between primary operation where the first DC input signal energizes the isolated AC bus and secondary operation wherein the second DC input signal energizes the isolated AC bus.

12. The method according to claim 1, further including rectifying, by the first and second gate driver modules, which comprises IC packages, the first isolated AC signal for generating voltage supply signals for the first and second gate driver modules.

13. The method according to claim 12, wherein the voltage supply signals include a first voltage supply signal, a negative voltage supply signal, and a programmable voltage supply signal.

14. A system, comprising:
   a supply control module configured to receive a first DC input signal and a second DC input signal and to generate a first control signal for controlling a first switch and a second control signal for controlling a second switch;
   a first transformer including a primary winding having one end configured for coupling to the first DC input signal and another end coupled to the first switch, and a second transformer including a primary winding having one end configured for coupling to the second DC input signal and another end coupled to the second switch, wherein the supply control module is configured to control the first and second control signals so that a secondary winding of the first or second transformer energizes an isolated AC bus coupled to the first and second transformers;
a first gate driver module for a motor phase configured to receive a first isolated AC signal generated by first and second coupled inductors, wherein the first coupled inductor is connected to the isolated AC bus; and
a second gate driver module for the motor phase configured to receive a second isolated AC signal generated by third and fourth coupled inductors, wherein the third coupled inductor is connected to the isolated AC bus.

15. The system according to claim 14, wherein the second coupled inductor is coupled to a first terminal configured for coupling to a high side driver of the motor phase.

16. The system according to claim 15, wherein the fourth coupled inductor is coupled to a first terminal configured for coupling to a low side driver of the motor phase.

17. The system according to claim 16, wherein the first coupled inductor is coupled to the isolated AC bus.

18. The system according to claim 17, wherein the first gate driver module controls a first motor switch configured for coupling the positive DC input to the motor phase, and the second gate driver module controls a second motor switch configured for coupling the negative DC input to the motor phase, and wherein the second coupled inductor is coupled to a node between the first and second motor switches.

19. The system according to claim 18, wherein an isolated AC voltage on the second coupled winding is referenced to the motor phase during operation of the motor.

20. The system according to claim 14, wherein the supply control module comprises an IC package.

21. The system according to claim 20, wherein the first and second gate driver modules comprise IC packages.

22. The system according to claim 14, wherein the system is configured such that there is no conversion back to DC of the first DC input signal and/or the second DC input signal until DC rectification in the first and second gate driver modules.

23. The system according to claim 14, wherein the supply control module comprises an oscillator and a regulator in a feed forward regulation configuration.

24. The system according to claim 14, wherein the supply control module is configured to automatically switch between primary operation where the first DC input signal energizes the isolated AC bus and secondary operation wherein the second DC input signal energizes the isolated AC bus.

25. The system according to claim 14, wherein the first and second gate driver modules, which comprise IC packages, include a rectifier for generating voltage supply signals for the first gate driver module.

26. The system according to claim 25, wherein the voltage supply signals include a first voltage supply signal, a negative voltage supply signal, and a programmable voltage supply signal.

* * * * *